US012777748B2

(12) United States Patent
Wang et al.

(10) Patent No.: US 12,777,748 B2
(45) Date of Patent: Oct. 27, 2026

(54) LED EPITAXIAL WAFER AND FABRICATION PROCESS THEREOF

(71) Applicant: FOCUS LIGHTINGS TECH CO., LTD., Suzhou (CN)

(72) Inventors: Wenjun Wang, Suzhou (CN); Han Jiang, Suzhou (CN); Guochang Li, Suzhou (CN); Yangyang Xu, Suzhou (CN); Hu Cheng, Suzhou (CN); Shuwei Yuan, Suzhou (CN)

(73) Assignee: FOCUS LIGHTINGS TECH CO., LTD., Suzhou (CN)

( * ) Notice: Subject to any disclaimer, the term of this patent is extended or adjusted under 35 U.S.C. 154(b) by 877 days.

(21) Appl. No.: 17/927,508

(22) PCT Filed: Aug. 24, 2022

(86) PCT No.: PCT/CN2022/114586
§ 371 (c)(1),
(2) Date: Nov. 23, 2022

(87) PCT Pub. No.: WO2023/206877
PCT Pub. Date: Nov. 2, 2023

(65) Prior Publication Data

US 2024/0258463 A1 Aug. 1, 2024

(30) Foreign Application Priority Data

Apr. 29, 2022 (CN) ........................ 202210473261.X

(51) Int. Cl.
*H10H 20/825* (2025.01)
*H10H 20/01* (2025.01)
(Continued)

(52) U.S. Cl.
CPC .. *H10H 20/8252* (2025.01); *H10H 20/01335* (2025.01); *H10H 20/812* (2025.01); *H10H 20/8162* (2025.01)

(58) Field of Classification Search
CPC ......... H10H 20/8252; H10H 20/01335; H10H 20/812; H10H 20/815; H10H 20/825; C30B 25/02; C30B 25/183
See application file for complete search history.

(56) References Cited

U.S. PATENT DOCUMENTS

2011/0187294 A1* 8/2011 Bergmann ........... H10H 20/811 315/363
2015/0083994 A1* 3/2015 Jain ...................... H10H 20/812 438/37
(Continued)

FOREIGN PATENT DOCUMENTS

CN 110364603 A 10/2019
CN 111987196 A * 11/2020 ........... H10H 20/812
(Continued)

OTHER PUBLICATIONS

International Search Report for International Application No. PCT/CN2022/114586, mailed Jan. 18, 2023, and its English translation, 6 pages.
(Continued)

*Primary Examiner* — Ori Nadav
(74) *Attorney, Agent, or Firm* — HOWARD M COHN and Associates, LLC

(57) ABSTRACT

The present application provides an LED epitaxial wafer and a fabrication process thereof, wherein an N-type GaN layer of the LED epitaxial wafer comprises an N_SL layer and an N_Bulk layer. N_SL layer and N_Bulk layer equivalently form multiple capacitive structures, and different silicon doping concentrations enhance the current diffusion and enhance the antistatic capability of LED epitaxial wafer. The
(Continued)

arrangement of N_SL layer and N_Bulk layer structure reduces the dislocation density of quantum well light-emitting layer and improves the lattice quality of quantum well light-emitting layer. In the manufacturing process of the LED epitaxial wafer provided by the present application, the SiH4 valve unit of the MOCVD device does not need a higher switching frequency, thereby improving the service life of the SiH4 valve unit.

7 Claims, 2 Drawing Sheets

(51) Int. Cl.
*H10H 20/812* (2025.01)
*H10H 20/816* (2025.01)

(56) References Cited

U.S. PATENT DOCUMENTS

2019/0386173 A1* 12/2019 Chen .................... H10H 20/812
2020/0058490 A1* 2/2020 Sumida ............. H01L 21/02658

FOREIGN PATENT DOCUMENTS

CN 114824016 A 7/2022
CN 217544639 U 10/2022
WO WO-2018012585 A1 * 1/2018 ........... H10H 20/825

OTHER PUBLICATIONS

First Chinese Office Action for corresponding Chinese Patent Application No. 202210473261.X, mailed Jul. 12, 2025.

* cited by examiner

LED EPITAXIAL WAFER AND FABRICATION PROCESS THEREOF

FIELD OF THE PRESENT DISCLOSURE

The present application relates to the field of LED technology, and more particularly, to an LED epitaxial wafer and a fabrication process thereof.

BACKGROUND OF THE PRESENT DISCLOSURE

A Light-Emitting Diode (LED) is a semiconductor light emitting device that converts electrical energy into optical energy. An LED epitaxial wafer refers to a specific single crystal film grown on a substrate heated to an appropriate temperature. Referring to FIG. 1, an LED epitaxial wafer generally includes a substrate, a buffer layer, an unintentionally doped GaN layer, an N-type GaN layer, a quantum well light-emitting layer, and a P-type GaN layer sequentially arranged from bottom to top. The growth of LED epitaxial wafer is mainly realized by Metal-organic Chemical Vapor Deposition (MOCVD) device.

The N-type GaN layer structure of the LED epitaxial wafer grown by the MOCVD device includes a N_Bulk structure and a N_SL structure. The N_Bulk structure can provide higher electron concentration, but the lattice mismatch with the unintentionally doped GaN layer in the lower layer and the quantum well light-emitting layer in the upper layer is relatively severe, and affects the crystal quality of the quantum well light-emitting layer. Compared with the N_Bulk structure, the N_SL structure can effectively reduce the lattice mismatch between the N-type GaN layer and the U-type GaN in the lower layer, but the N_SL structure can lead to large fluctuation of the light-emitting voltage due to the difference of N electrode etching. In addition, the SiH4 valve unit of MOCVD equipment needs higher switching frequency during the growth process, which reduces the service life of SiH4 valve unit and increases the production cost.

In addition, during the production, installation and use of the LED, it is inevitable to generate induced charge due to electrostatic influence. If the induced charge is not timely released, a higher voltage will be established across the PN junction. Traditional LED epitaxial wafer has poor antistatic capability. When the voltage exceeds the maximum withstand value of LED epitaxial wafer, the electrostatic charge will discharge at the two ends of PN junction in a very short moment, thereby resulting in breakdown of PN junction and LED failure.

SUMMARY OF THE PRESENT DISCLOSURE

The present application provides an LED epitaxial wafer and a fabrication process thereof, so as to solve the problems with respect to a conventional LED epitaxial wafer, such as a large lattice mismatch, a high production cost and a poor antistatic capability.

In one aspect, the present application provides an LED epitaxial wafer comprising a substrate, a buffer layer, an unintentionally doped GaN layer, an N-type GaN layer, a quantum well light-emitting layer, a P-type electron blocking layer and a P-type GaN layer arranged in a stack in sequence. The N-type GaN layer comprises: an N_SL layer and an N_Bulk layer disposed on the N_SL layer, and the thickness of the N_SL layer is less than the thickness of the N_Bulk layer.

The N_SL layer comprises several first N_SL layers and several second N_SL layers. The N_Bulk layer includes a first N_Bulk layer and a second N_Bulk layer disposed on the first N_Bulk layer.

The silicon doping concentration of the first N_SL layer is less than the silicon doping concentration of the second N_SL layer. The silicon doping concentration of the first N_Bulk layer is greater than the silicon doping concentration of the second N_Bulk layer. The silicon doping concentration of the first N_SL layer is less than the silicon doping concentration of the second N_Bulk layer.

An N_SL layer and an N_Bulk layer equivalently form multiple capacitive structures, and different silicon doping concentrations enhance the current diffusion and enhance the antistatic capability of LED epitaxial wafer. The N_SL layer and N_Bulk layer structure reduces the dislocation density of quantum well light-emitting layer during the growth thereof and improves the lattice quality of quantum well light-emitting layer.

Optionally, the first N_SL layer and the second N_SL layer are arranged repeatedly in sequence from bottom to top, the number of repetitions being between 10 and 20.

Optionally, the silicon doping concentration of the first N_SL layer is between $1\times10^{18}$ and $5\times10^{18}/cm^{-3}$; the silicon doping concentration of the second N_SL layer is between $1\times10^{19}$ and $3\times10^{19}/cm^{-3}$; the silicon doping concentration of the first N_Bulk layer is between $1\times10^{19}$ and $3\times10^{19}/cm^{-3}$; the silicon doping concentration of the second N_Bulk layer is between $5\times10^{18}$ and $1\times10^{19}/cm^{-3}$.

Optionally, the thickness of the first N_SL layer is between 15 and 20 nm; the thickness of the second N_SL layer is between 30 and 35 nm; the thickness of the N_SL layer is between 450 and 550 nm.

Optionally, the thickness of the first N_Bulk layer is between 500 and 600 nm; the thickness of the second N_Bulk layer is between 500 and 600 nm; the thickness of the N Bulk layer is between 1000 and 1200 nm.

Optionally, the quantum well light-emitting layer comprises a GaN layer and an $In_xGa_{1-x}N$ layer which are arranged repeatedly in sequence, x is between 0.2 and 0.3, and the number of repetitions is between 7 and 12; the thickness of the GaN layer is between 8 nm and 12 nm; the thickness of the $In_xGa_{1-x}N$ layer is between 2 and 5 nm.

In another aspect, the present application also provides an LED epitaxial wafer fabrication process of the above-mentioned LED epitaxial wafer, which comprises:

- preparing a substrate, and growing a buffer layer on the substrate; wherein the growth temperature of the buffer layer is between 800° C. and 1100° C.;
- growing an unintentionally doped GaN layer on the buffer layer; wherein the growth temperature of the unintentionally doped GaN layer is between 1000° C. and 1400° C.;
- Growing a first N_SL layer and a second N_SL layer repeatedly in sequence on the unintentionally doped GaN layer to provide an N_SL layer; the number of repetitions is between 10 and 20; wherein the growth temperature of the first N_SL layer is between 1000° C. and 1200° C.; the growth thickness of the first N_SL layer is between 15 nm and 20 nm; the growth temperature of the second N_SL layer is between 1000° C. and 1200° C.; the growth thickness of the second N_SL layer is between 30 nm and 35 nm;
- growing a first N_Bulk layer on the N_SL layer; wherein the growth temperature of the first N_Bulk layer is between 1000° C. and 1200° C.; the growth thickness of the first N_Bulk layer is between 500 nm and 600 nm;

growing a second N_Bulk layer on the first N_Bulk layer; wherein the growth temperature of the second N_Bulk layer is between 900° C. and 1100° C.; the growth thickness of the second N_Bulk layer is between 500 nm and 600 nm;

growing a quantum well light-emitting layer on the second N_Bulk layer; wherein the growth temperature of the quantum well light-emitting layer is between 700° C. and 800° C.;

growing a P-type electron blocking layer on the quantum well light-emitting layer; wherein the growth temperature of the P-type electron blocking layer is between 800° C. and 1000° C.;

growing a P-type GaN layer on the P-type electron blocking layer; wherein the growth temperature of the P-type GaN layer is between 900 and 1100 C.

Optionally, the silicon doping concentration of the first N_SL layer is between $1\times10^{18}$ and $5\times10^{18}/cm^{-3}$; the silicon doping concentration of the second N_SL layer is between $1\times10^{19}$ and $3\times10^{19}/cm^{-3}$; the silicon doping concentration of the first N_Bulk layer is between $1\times10^{19}$ and $3\times10^{19}/cm^{-3}$; the silicon doping concentration of the second N_Bulk layer is between $5\times10^{18}$ and $1\times10^{19}/cm^{-3}$.

In the present application, an LED epitaxial wafer and a fabrication process thereof are provided, wherein the LED epitaxial wafer comprises a substrate, a buffer layer, an unintentionally doped GaN layer, an N-type GaN layer, a quantum well light-emitting layer, a P-type electron blocking layer and a P-type GaN layer which are arranged in a stack in sequence. Wherein the N-type GaN layer comprises an N_SL layer and an N_Bulk layer arranged on the N_SL layer. The N_SL layer comprises several first N_SL layers and several second N_SL layers, the first N_SL layers and the second N_SL layers are arranged repeatedly in sequence from bottom to top, and the N_Bulk layer comprises a first N_Bulk layer and a second N_Bulk layer. The silicon doping concentration of the first N_SL layer is less than the silicon doping concentration of the second N_SL layer, the silicon doping concentration of the first N_Bulk layer is greater than the silicon doping concentration of the second N_Bulk layer, and the silicon doping concentration of the first N_SL layer is less than the silicon doping concentration of the second N_Bulk layer. N_SL layer and N_Bulk layer equivalently form a plurality of capacitive structures, and at the same time, different silicon doping concentrations enhance the current diffusion and improve the antistatic capability of LED epitaxial wafer. The N_SL layer and N_Bulk layer structure reduces the dislocation density of quantum well light-emitting layer and improves the lattice quality of quantum well light-emitting layer. In the manufacturing process of the LED epitaxial wafer in the present application, the SiH4 valve unit of the MOCVD device does not need a higher switching frequency, thereby improving the service life of the SiH4 valve unit.

BRIEF DESCRIPTION OF THE DRAWINGS

In order to illustrate the technical solution of the present application more clearly, the following will briefly describe the drawings to be used in the embodiments, and it would be apparent for a person skilled in the art to obtain other drawings according to these drawings without involving any creative effort.

DESCRIPTION OF THE EMBODIMENTS

Reference will now be made in detail to the embodiments, with their examples illustrated in the accompanying drawings. When the following description refers to the accompanying drawings, like numerals in different drawings indicate the same or similar elements, unless otherwise indicated. The embodiments described in the following examples do not represent all embodiments in accordance with the present application.

These are merely examples of systems and methods in accordance with certain aspects of the present application as detailed in the claims.

Figure 1:
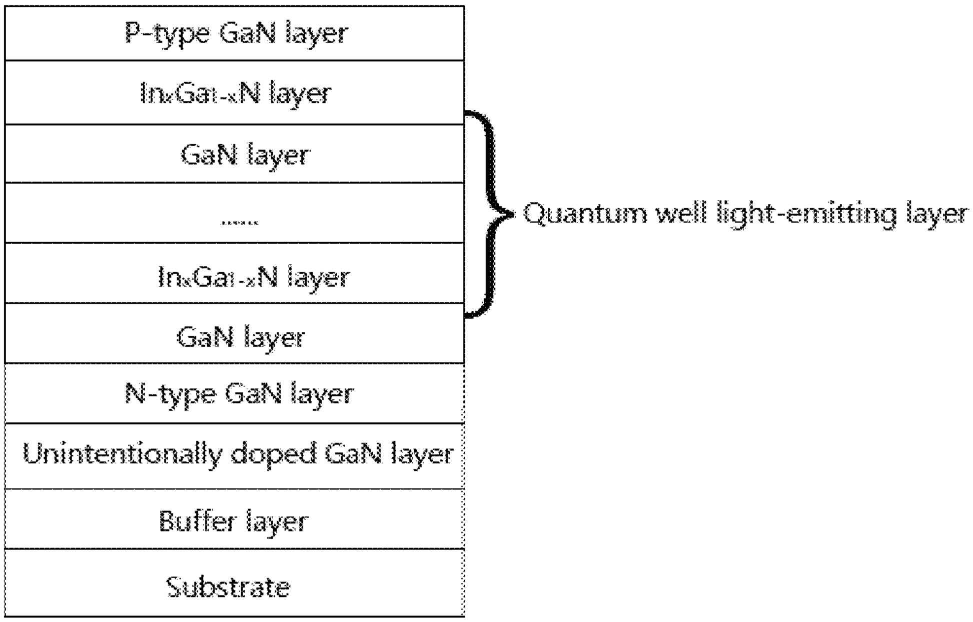
FIG. 1 is a schematic view of a conventional LED epitaxial wafer in the present application.

An LED epitaxial wafer refers to a particular single crystal film grown on a substrate heated to an appropriate temperature. Referring to FIG. 1, a conventional LED epitaxial wafer generally includes a substrate, a buffer layer, an unintentionally doped GaN layer, an N-type GaN layer, a quantum well light-emitting layer, and a P-type GaN layer sequentially arranged from bottom to top. The N-type GaN layer structure generally includes two types such as an N_Bulk structure and an N_SL structure. A conventional N_SL structure includes a plurality of layers of GaN layer doped with no silicon and GaN layer doped with silicon repeatedly in sequence, and the N_Bulk structure includes two stacked layers of GaN layer doped with silicon. Among them, the N_Bulk structure can have a higher electron concentration, but the lattice mismatch with the underlying unintentionally doped GaN layer is larger, resulting in dislocation to propagate into the quantum well light-emitting layer, affecting the lattice quality of the quantum well light-emitting layer and lowering the light-emitting efficiency. The N_SL structure can effectively reduce the lattice mismatch between the N-type GaN layer and the underlying unintentionally doped GaN layer, reduce the dislocation propagating from the underlying layer into the quantum well light-emitting layer, and improve the lattice quality. However, the N_SL structure will cause large fluctuations in the light-emitting voltage due to the difference in etching depth of the N electrode. Furthermore, the N_SL structure requires a higher switching frequency in the SiH4 valve unit of MOCVD equipment during the manufacturing process, which reduces the service life of SiH4 valve unit. In addition, conventional LED epitaxial wafers have poor antistatic capability, which can lead to LED failure if the PN junction is broken down.

Figure 2:
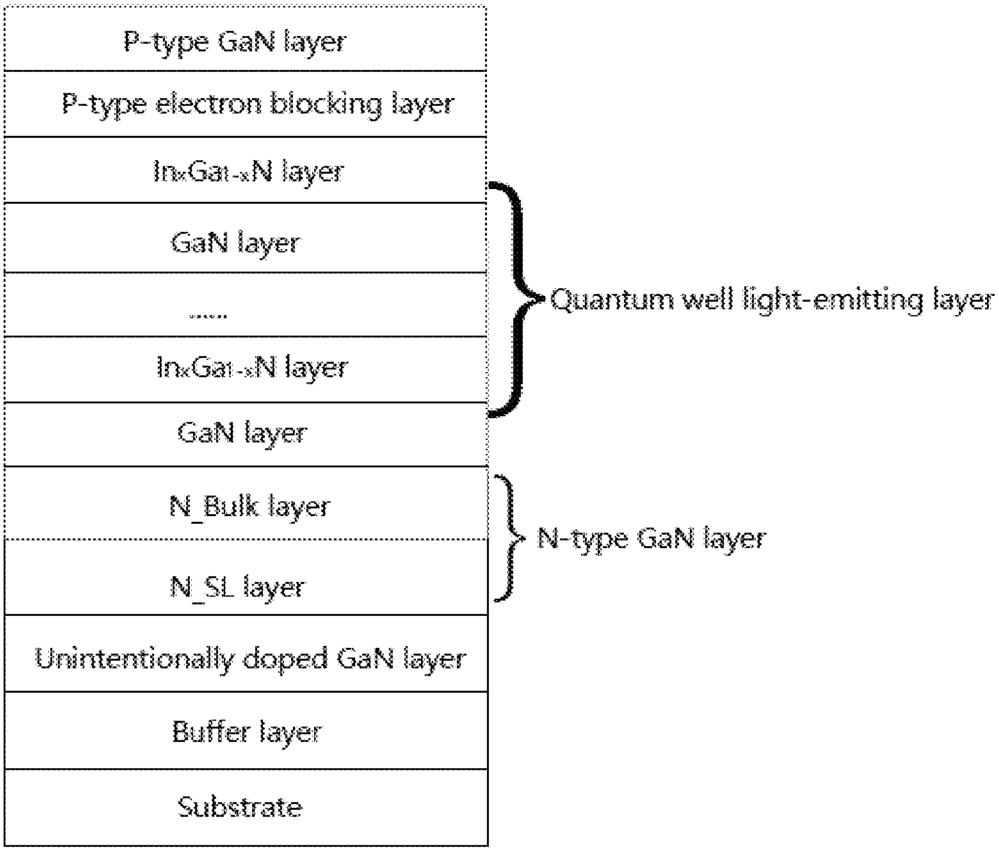
FIG. 2 is a schematic view of an LED epitaxial wafer in an embodiment of the present application.
Figure 3:
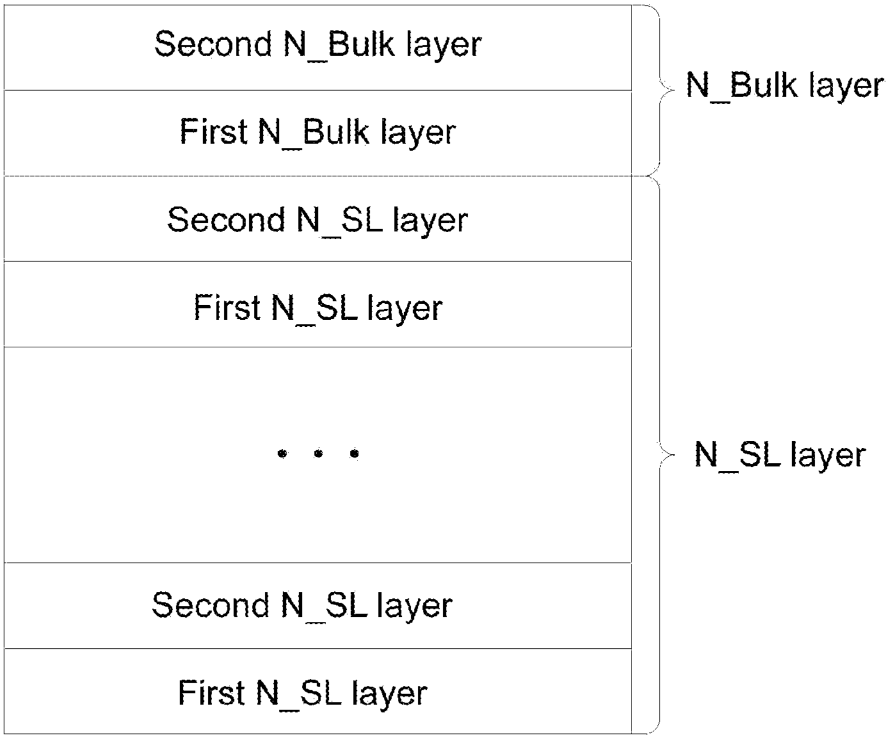
FIG. 3 is a schematic view of the N-type GaN layer structure of the LED epitaxial wafer in the embodiment of the present application.

Based on the above problems, embodiments of the present application provide an LED epitaxial wafer. Referring to FIG. 2, the LED epitaxial wafer in this embodiment includes a substrate, a buffer layer, an unintentionally doped GaN layer, an N-type GaN layer, a quantum well light-emitting layer, a P-type electron blocking layer and a P-type GaN layer, which are sequentially arranged from bottom to top, wherein the N-type GaN layer comprises an N_SL layer and an N_Bulk layer, and the N_Bulk layer is arranged over the N_SL layer. Referring to FIG. 3, the N_SL layer comprises several first N_SL layers and several second N_SL layers, and the first N_SL first N_SL layers and the second N_SL layers are arranged repeatedly in sequence from bottom to top, and the number of repetitions is between 10 and 20. The N_Bulk layer includes a first N_Bulk layer and a second N_Bulk layer, and the second N_Bulk layer is disposed over the first N_Bulk layer.

Figure 4:
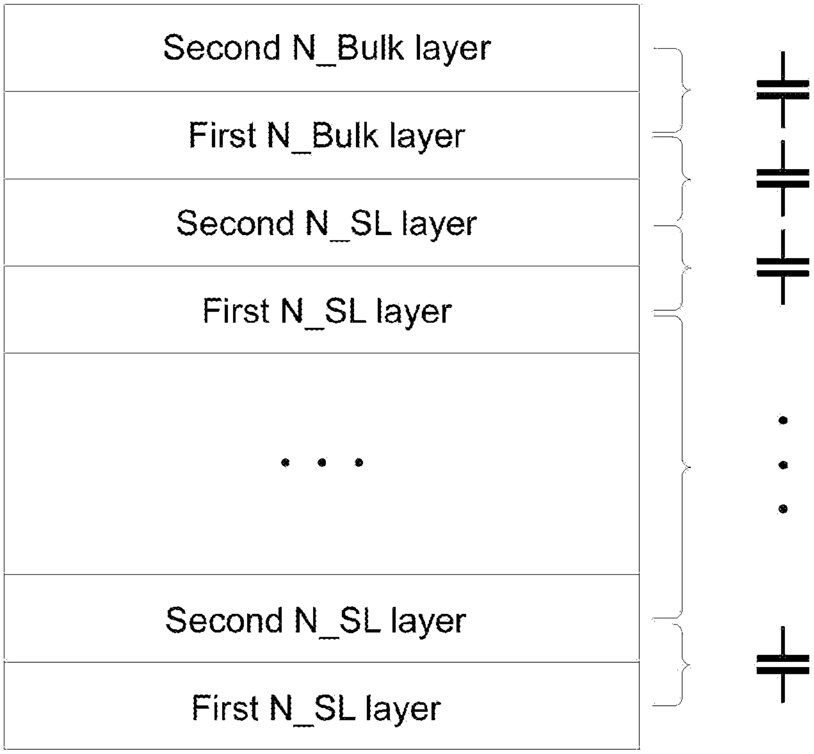
FIG. 4 is a schematic view of the equivalent capacitance of an N-type GaN layer of an LED epitaxial wafer in an embodiment of the present application.

Referring to FIG. 4, the N-type GaN layer structure of the LED epitaxial wafer in the embodiment of the present application equivalently forms a plurality of capacitor structures, and the potential difference across the capacitor accelerates the electron transmission rate, so that the electron concentration of the quantum well light-emitting layer can be increased, thereby improving the light-emitting brightness of the LED. Through the multi-layer structure design of N_SL layer and N_Bulk layer, the lattice mismatch with unintentionally doped GaN layer can be reduced step by step, the dislocation density of quantum well light-emitting layer can be reduced, the lattice quality of quantum well light-emitting layer can be improved, and the luminescent efficiency can be improved.

The thickness of the N_SL layer is less than the thickness of the N_Bulk layer. The thickness of each layer can be set according to production requirements, and in one embodiment, the thickness of the first N_SL layer is between 15 and 20 nm and the thickness of the second N_SL layer is between 30 and 35 nm. The thickness of the N_SL layer formed by multiple cycles of the first N_SL layer and the second N_SL layer is between 450 and 550 nm. The thickness of the first N_Bulk layer is between 500 and 600 nm and the thickness of the second N_Bulk layer is between 500 and 600 nm. The thickness of the N_Bulk layer is between 1000 and 1200 nm.

See Table 2 for a comparison of the operating parameters of the LED epitaxial wafer structure, the thickness of the N_SL layer and the thickness of the N_Bulk layer in different value ranges in the examples of the present application. Herein, referring to Table 1, sample 11 represents an LED epitaxial wafer having a first N_SL layer with a thickness of 18 nm, a second N_SL layer with a thickness of 32 nm, an N_SL layer with a thickness of 500 nm, a first N_Bulk layer with a thickness of 550 nm, a second N_Bulk layer with a thickness of 550 nm, and an N_Bulk layer with a thickness of 1100 nm. Sample 12 represents an LED epitaxial wafer with the first N_SL layer thickness of 15 nm, the second N_SL layer thickness of 30 nm, an N_SL layer thickness of 450 nm, the first N_Bulk layer thickness of 500 nm, the second N_Bulk layer thickness of 500 nm, and an N_Bulk layer thickness of 1000 nm. Sample 13 represents an LED epitaxial wafer with the first N_SL layer thickness of 20 nm, the second N_SL layer thickness of 35 nm, an N_SL layer thickness of 550 nm, the first N_Bulk layer thickness of 600 nm, the second N_Bulk layer thickness of 600 nm, and an N_Bulk layer thickness of 1200 nm. Sample 21 represents an LED epitaxial wafer wherein the thickness of both the N_SL layer and the N_Bulk layer is slightly less than the minimum of the corresponding ranges in the examples of the present application (i.e., the thickness of the N_SL layer is slightly less than 450 nm and the thickness of the N_Bulk layer is slightly less than 1000 nm). Sample 22 represents an LED epitaxial wafer in which the thickness of both the N_SL layer and the N_Bulk layer is slightly greater than the maximum of the corresponding range in the examples of the present application (i.e., the thickness of the N_SL layer is slightly greater than 550 nm and the thickness of the N_Bulk layer is slightly greater than 1200 nm).

A range of "slightly less than" and/or "slightly greater than" in an embodiment of the present disclosure is within ten percent of the length of the numeric interval in an embodiment of the present disclosure. For example, the thickness of the N_SL layer in the embodiments of the present application is between 450 and 550 nm, and the length of the numeric interval is 550 nm-450 nm=100 nm. The thickness of the N_SL layer in sample 21 was slightly less than 450 nm, i.e., the thickness of the N_SL layer was between 440 and 450 nm (440 nm=450 nm−(550 nm−450 nm)×10%). The thickness of the N_SL layer in sample 22 was slightly greater than 550 nm, i.e., the thickness of the N_SL layer was between 550 and 560 nm (560 nm=550 nm+(550 nm−450 nm)×10%).

The operating parameter, lop, in the examples of this application was used to characterize sample brightness, with higher values indicating better performance. VF1 is the working voltage of sample, the smaller the value, the less the energy consumption. IR is the reverse breakdown current used to characterize the crystal quality, and the smaller the number, the better the crystal quality. ESD is the antistatic capability, which indicates the probability that a sample passes the antistatic test, the larger the number, the better the antistatic capability. WLD is the sample emission wavelength.

TABLE 1

| Thickness | First N_SL layer | Second N_SL layer | N_SL layer | First N_Bulk layer | Second N_Bulk layer | N_Bulk layer |
|---|---|---|---|---|---|---|
| Sample 11 | 18 nm | 32 nm | 500 nm | 550 nm | 550 nm | 1100 nm |
| Sample 12 | 15 nm | 30 nm | 450 nm | 500 nm | 500 nm | 1000 nm |
| Sample 13 | 20 nm | 35 nm | 550 nm | 600 nm | 600 nm | 1200 nm |

TABLE 2

| | Lop | VF1 | IR | ESD | WLD |
|---|---|---|---|---|---|
| Sample 11 | 274.3 mW | 3.107 V | 0.0027 A | 98.90% | 454.5 nm |
| Sample 12 | 274.3 mW | 3.109 V | 0.0026 A | 98.80% | 454.5 nm |
| Sample 13 | 274.4 mW | 3.106 V | 0.0028 A | 98.90% | 454.5 nm |
| Sample 21 | 273.0 mW | 3.109 V | 0.0041 A | 94.60% | 454.5 nm |
| Sample 22 | 273.5 mW | 3.112 V | 0.0031 A | 92.40% | 454.5 nm |

As can be seen from Table 2, for the LED epitaxial wafer with the thickness of the N_SL layer and the thickness of the N_Bulk layer within the range of values in the present application, it has higher brightness, lower working voltage, better crystal quality and enhanced antistatic capability.

The silicon doping concentration of the first N_SL layer is less than the silicon doping concentration of the second N_SL layer, the silicon doping concentration of the first N_Bulk layer is greater than the silicon doping concentration of the second N_Bulk layer, and the silicon doping concentration of the first N_SL layer is less than the silicon doping concentration of the second N_Bulk layer.

In one embodiment, the silicon doping concentration of the first N_SL layer is between $1\times10^{18}$ and $5\times10^{18}/cm^{-3}$ and the growth temperature of the first N_SL layer is between 1000 and 1200° C. The silicon doping concentration of the second N_SL layer is between $1\times10^{19}$ and $3\times10^{19}/cm^{-3}$, and the growth temperature of the second N_SL layer is between 100° and 1200° C. The silicon doping concentration of the first N Bulk layer is between $1\times10^{19}$ and $3\times10^{19}/cm^{-3}$, and the growth temperature of the first N Bulk layer is between 1000 and 1200° C. The silicon doping concentration of the second N_Bulk layer is between $5\times10^{18}$ and $1\times10^{19}/cm^{-3}$, and the growth temperature of the second N_Bulk layer is between 90° and 1100° C.

See Table 4 for a comparison of the operating parameters of the LED epitaxial wafer structure, the silicon doping concentration of the N_SL layer and the silicon doping concentration of the N_Bulk layer in different value ranges in the examples of the present application. Herein, referring to Table 3, sample 14 represents an LED epitaxial wafer having a silicon doping concentration of $3\times10^{18}/cm^{-3}$ for the first N_SL layer, $2\times10^{19}/cm^{-3}$ for the second N_SL layer, $2\times10^{19}/cm^{-3}$ for the first N_Bulk layer, and $8\times10^{18}/cm^{-3}$ for the second N_Bulk layer. Sample 15 represents an LED epitaxial wafer with a silicon doping concentration of $1\times10^{18}/cm^{-3}$ for the first N_SL layer, $1\times10^{19}/cm^{-3}$ for the second N_SL layer, $1\times10^{19}/cm^{-3}$ for the first N_Bulk layer, and $5\times10^{18}/cm^{-3}$ for the second N_Bulk layer. Sample 16 represents an LED epitaxial wafer with a silicon doping concentration of $5\times10^{18}/cm^{-3}$ for the first N_SL layer, $3\times10^{19}/cm^{-3}$ for the second N_SL layer, $3\times10^{19}/cm$ 3 for the first N_Bulk layer, and $1\times10^{19}/cm^{-3}$ for the second N_Bulk layer. Sample 31 represents an LED epitaxial wafer wherein the silicon doping concentrations of the first N_SL layer, the second N_SL layer, the first N_Bulk layer and the second N_Bulk layer are all slightly less than the minimum of the corresponding ranges in the examples of the present application. Sample 32 represents an LED epitaxial wafer wherein the silicon doping concentrations of the first N_SL layer, the second N_SL layer, the first N_Bulk layer, and the second N_Bulk layer are all slightly greater than the maximum of the corresponding ranges in the examples of the present application.

TABLE 3

| Silicon doping concentration | First N_SL layer | Second N_SL layer | First N_Bulk layer | Second N_Bulk layer |
|---|---|---|---|---|
| Sample 14 | $3 \times 10^{18}/cm^{-3}$ | $2 \times 10^{19}/cm^{-3}$ | $2 \times 10^{19}/cm^{-3}$ | $8 \times 10^{18}/cm^{-3}$ |
| Sample 15 | $1 \times 10^{18}/cm^{-3}$ | $1 \times 10^{19}/cm^{-3}$ | $1 \times 10^{19}/cm^{-3}$ | $5 \times 10^{18}/cm^{-3}$ |
| Sample 16 | $5 \times 10^{18}/cm^{-3}$ | $3 \times 10^{19}/cm^{-3}$ | $3 \times 10^{19}/cm^{-3}$ | $1 \times 10^{19}/cm^{-3}$ |

TABLE 4

| | Lop | VF1 | IR | ESD | WLD |
|---|---|---|---|---|---|
| Sample 14 | 274.3 mW | 3.107 V | 0.0027 A | 98.90% | 454.5 nm |
| Sample 15 | 274.4 mW | 3.116 V | 0.0029 A | 98.70% | 454.5 nm |
| Sample 16 | 274.6 mW | 3.105 V | 0.0026 A | 98.80% | 454.5 nm |
| Sample 31 | 273.1 mW | 3.012 V | 0.0039 A | 94.80% | 454.5 nm |
| Sample 32 | 273.1 mW | 3.098 V | 0.0035 A | 95.70% | 454.5 nm |

As can be seen from Table 4, for the LED epitaxial wafer with the silicon doping concentration of the N_SL layer and the silicon doping concentration of the N_Bulk layer within the range of values in the present application, it has higher brightness, lower working voltage, better crystal quality and enhanced antistatic capability.

Based on the LED epitaxial wafer structure in the example of the present application, see Table 6 for a comparison of the operating parameters of the growth temperature of the N_SL layer and the growth temperature of the N_Bulk layer in different value ranges. Herein, referring to Table 5, sample 17 represents an LED epitaxial wafer having a growth temperature of 1100° C. for the first N_SL layer, 1100° C. for the second N_SL layer, 1100° C. for the first N_Bulk layer, and 1000° C. for the second N_Bulk layer. Sample 18 represents an LED epitaxial wafer having a growth temperature of 1000° C. for the first N_SL layer, 1000° C. for the second N_SL layer, 1000° C. for the first N_Bulk layer, and 900° C. for the second N_Bulk layer. Sample 19 represents an LED epitaxial wafer having a growth temperature of 1200° C. for the first N_SL layer, 1200° C. for the second N_SL layer, 1200° C. for the first N_Bulk layer, and 1100° C. for the second N_Bulk layer. Sample 41 represents an LED epitaxial wafer where the growth temperatures of the first N_SL layer, the second N_SL layer, the first N_Bulk layer and the second N_Bulk layer are all slightly less than the minimum of the corresponding ranges in the examples of the present application. Sample 42 represents an LED epitaxial wafer where the growth temperatures of the first N_SL layer, the second N_SL layer, the first N_Bulk layer and the second N_Bulk layer are all slightly greater than the maximum of the corresponding ranges in the examples of the present application.

TABLE 5

| Growth temperature | First N_SL layer | Second N_SL layer | First N_Bulk layer | Second N_Bulk layer |
|---|---|---|---|---|
| Sample 17 | 1100 °C | 1100 °C | 1100 °C | 1000 °C |
| Sample 18 | 1000 °C | 1000 °C | 1000 °C | 900 °C |
| Sample 19 | 1200 °C | 1200 °C | 1200 °C | 1100 °C |

TABLE 6

| | Lop | VF1 | IR | ESD | WLD |
|---|---|---|---|---|---|
| Sample 17 | 274.3 mW | 3.107 V | 0.0027 A | 98.90% | 454.5 nm |
| Sample 18 | 274.6 mW | 3.107 V | 0.0025 A | 98.60% | 454.5 nm |
| Sample 19 | 274.4 mW | 3.107 V | 0.0027 A | 98.50% | 454.5 nm |
| Sample 41 | 273.3 mW | 3.106 V | 0.0033 A | 95.50% | 454.5 nm |
| Sample 42 | 273.5 mW | 3.115 V | 0.0029 A | 93.50% | 454.5 nm |

As can be seen from Table 6, for the LED epitaxial wafer with the growth temperature of the N_SL layer and the growth temperature of the N_Bulk layer within the range of values in the present application, it has higher brightness, lower working voltage, better crystal quality and enhanced antistatic capability.

According to the embodiments of the present application, it provides different silicon doping concentrations, growth thicknesses and growth temperatures for the N_SL layer and the N_Bulk layer. High- or low-silicon doping can enhance current diffusion, and high- or low-silicon doping includes high-silicon doping and low-silicon doping, wherein the low-silicon doping part has certain restriction ability to electrons, and can improve the existence concentration of two-dimensional electron gas, thereby enhancing the antistatic capability of LED epitaxial wafer. Meanwhile, the electron mobility can be improved, the luminescence voltage can be reduced and the stability of luminescence voltage can be improved. It can further release stress upon the cooperation of high- or low-silicon doping and high or low temperature for growth, thereby improving the growth quality of the whole epitaxial structure. Furthermore, in the LED epitaxial wafer of the embodiment of the present application, since the silicon doping operation is required throughout the whole growth stage of the N-type GaN layer, the SiH4 valve unit of the MOCVD device is maintained in a normally open state. It is only necessary to adjust the opening degree of the SiH4 valve unit according to different silicon doping concentrations, so as to avoid high-frequency switching of the switch state of the SiH4 valve unit, thereby extending the service life of the SiH4 valve unit.

The quantum well light-emitting layer in the embodiments of the present application is a multi-layer GaN/$In_xGa_{1-x}N$ structure comprising a GaN layer and an $In_xGa_{1-x}N$ layer which are arranged repeatedly in sequence, wherein the GaN layer is a barrier layer and the $In_xGa_{1-x}N$ is a potential well layer. In one embodiment, the number of repetitions is between 7 and 12, x value is between 0.2 and 0.3, the thickness of barrier layer is between 8 and 12 nm, and the thickness of potential well layer is between 2 and 5 nm.

The working parameters of the LED epitaxial wafer in the examples of the present application are compared with those of a conventional LED epitaxial wafer, see table 7. Here, sample 0 represents a conventional LED epitaxial wafer, and Sample 1 represents an LED epitaxial wafer in the examples of the present application.

TABLE 7

| | Lop | VF1 | IR | ESD | WLD |
|---|---|---|---|---|---|
| Sample 0 | 272.2 mW | 3.121 V | 0.0055 A | 90.30% | 454.3 nm |
| Sample 1 | 274.3 mW | 3.107 V | 0.0027 A | 98.90% | 454.5 nm |
| Difference | 0.77% | −0.45% | −50.91% | 9.52% | |

It can be seen from Table 7 that, as compared with a conventional LED epitaxial wafer, in the LED epitaxial wafer in the examples of the present application, the N_SI layer and the N_Bulk layer comprise a multi-layer structure; by defining the thickness, growth temperature and silicon doping concentration of different layer structures, the luminescence brightness is improved, the working voltage is reduced, the crystal quality is improved, and a good antistatic capability is provided.

Embodiments of the present invention also provide a fabrication process of the LED epitaxial wafer, for fabricating LED epitaxial wafer described above in the embodiments of the present invention. The method includes following steps.

It prepares a substrate and grows a buffer layer on the substrate. The growth temperature of the buffer layer is between 800 and 1100° C. The growth thickness of the buffer layer is between 15 and 30 nm. Here, the substrate may be a sapphire ($Al_2O_3$) substrate.

An unintentionally doped GaN layer is grown on the buffer layer. The growth temperature of the unintentionally doped GaN layer is between 100° and 1400° C. The growth thickness of the unintentionally doped GaN layer is between 2 and 4 μm.

A first N_SL layer and a second N_SL layer are grown repeatedly in sequence on the unintentionally doped GaN layer to provide an N_SL layer. The number of repetitions is between 10 and 20 depending on production requirements. The silicon doping concentration of the first N_SL layer is between $1\times10^{18}$ and $5\times10^{18}$/cm$^{-3}$, the growth temperature of the first N_SL layer is between 100° and 1200° C., and the growth thickness of the first N_SL layer is between 15 and 20 nm. The silicon doping concentration of the second N_SL layer is between $1\times10^{19}$ and $3\times10^{19}$/cm$^{-3}$, the growth temperature of the second N_SL layer is between 100° and 1200° C., and the growth thickness of the second N_SL layer is between 30 and 35 nm.

A first N_Bulk layer is grown on the N_SL layer. The silicon doping concentration of the first N_Bulk layer is between $1\times10^{19}$ and $3\times10^{19}$/cm$^{-3}$, the growth temperature of the first N_Bulk layer is between 100° and 1200° C., and the growth thickness of the first N_Bulk layer is between 500 and 600 nm.

A second N_Bulk layer is grown on the first N_Bulk layer. The silicon doping concentration of the second N_Bulk layer is between $5\times10^{18}$ and $1\times10^{19}$/cm$^{-3}$, the growth temperature of the second N_Bulk layer is between 90° and 1100° C., and the growth thickness of the second N_Bulk layer is between 500 and 600 nm.

The growth rate of the first N_Bulk layer and the second N_Bulk layer is between 6 and 9 μm/h.

A quantum well light-emitting layer is grown on the second N_Bulk layer. The growth temperature of the quantum well light-emitting layer is between 700° C. and 800° C.

A p-type electron blocking layer is grown on the quantum well light-emitting layer. The growth temperature of the p-type electron blocking layer is between 800° C. and 1000° C.

A P-type GaN layer is grown on the P-type electron blocking layer. The growth temperature of the P-type GaN layer is between 900° C. and 1100° C.

In the present application, an LED epitaxial wafer and a fabrication process thereof, wherein the LED epitaxial wafer comprises a substrate, a buffer layer, an unintentionally doped GaN layer, an N-type GaN layer, a quantum well light-emitting layer, a P-type electron blocking layer and a P-type GaN layer which are arranged in a stack in sequence. Herein, the N-type GaN layer comprises an N_SL layer and an N_Bulk layer arranged on the N_SL layer. The N_SL layer comprises several first N_SL layers and several second N_SL layers, the first N_SL layers and the second N_SL layers are arranged repeatedly in sequence from bottom to top, and the N_Bulk layer comprises a first N_Bulk layer and a second N_Bulk layer. The silicon doping concentration of the first N_SL layer is less than the silicon doping concentration of the second N_SL layer, the silicon doping concentration of the first N_Bulk layer is greater than the silicon doping concentration of the second N_Bulk layer, and the silicon doping concentration of the first N_SL layer is less than the silicon doping concentration of the second N_Bulk layer. N_SL layer and N_Bulk layer equivalently form a plurality of capacitive structures, and at the same time, different silicon doping concentrations enhance the current diffusion and improve the antistatic capability of LED epitaxial wafer. The arrangement of N_SL layer and N_Bulk layer structure reduces the dislocation density of quantum well light-emitting layer and improves the lattice quality of quantum well light-emitting layer. In the manufacturing process of the LED epitaxial wafer in the present application, the SiH4 valve unit of the MOCVD device does not need a higher switching frequency, thereby improving the service life of the SiH4 valve unit.

With regard to similar parts between the embodiments of the present application, reference can be made to each other.

The embodiments described above are merely examples of what is conceived of in the present application and are not to be construed as limiting the scope of the application. For a person skilled in the art, any other embodiment extended according to the solution of the present application falls within the scope of protection of the present application without involving any creative effort.

What is claimed is:

1. An LED epitaxial wafer, comprising a substrate, a buffer layer, an unintentionally doped GaN layer, an N-type GaN layer, a quantum well light-emitting layer, a P-type electron blocking layer and a P-type GaN layer which are successively arranged in a stack, wherein the N-type GaN layer comprises: an N_SL layer and an N_Bulk layer provided on the N_SL layer; and the thickness of the N_SL layer is less than the thickness of the N_Bulk layer;

the N_SL layer comprises several first N_SL layers and several second N_SL layers; the N_Bulk layer comprises a first N_Bulk layer and a second N_Bulk layer arranged on the first N_Bulk layer;

the silicon doping concentration of the first N_SL layer is less than the silicon doping concentration of the second N_SL layer; the silicon doping concentration of the first N_Bulk layer is greater than the silicon doping concentration of the second N_Bulk layer; and the silicon doping concentration of the first N_SL layer is less than the silicon doping concentration of the second N_Bulk layer;

the first N_SL layer and the second N_SL layer are arranged repeatedly in sequence from bottom to top, with the number of repetitions being 10-20;

the first N_SL layer and the second N_SL layer are grown on the unintentionally doped GaN layer repeatedly in sequence from bottom to top, and the first N Bulk layer and the second N Bulk layer are grown on the N_SL layer repeatedly in sequence, the growth temperature of the first N_SL layer is 1000-1200° C., the growth temperature of the second N_SL layer is 1000-1200° C., the growth temperature of the first N_Bulk layer is 1000-1200° C., and the growth temperature of the second N_Bulk layer is 900-1100° C.

2. The LED epitaxial wafer according to claim 1, characterized in that the silicon doping concentration of the first N_SL layer is $1\times10^{16}$~$5\times10^{18}$/cm$^{-3}$; the silicon doping concentration of the second N_SL layer is $1\times10^{19}$~$3\times10^{19}$/cm$^{-3}$; the silicon doping concentration of the first N_Bulk layer is $1\times10^{19}$~$3\times10^{19}$/cm$^{-3}$; and the silicon doping concentration of the second N_Bulk layer is $5\times10^{18}$~$1\times10^{19}$/cm$^{-3}$.

3. The LED epitaxial wafer according to claim 2, characterized in that the thickness of the first N_SL layer is 15-20 nm; the thickness of the second N_SL layer is 30-35 nm; and the thickness of the N_SL layer is 450-550 nm.

4. The LED epitaxial wafer according to claim 2, characterized in that the thickness of the first N_Bulk layer is 500-600 nm; the thickness of the second N_Bulk layer is 500-600 nm; and the thickness of the N_Bulk layer is 1000-1200 nm.

5. The LED epitaxial wafer according to claim 1, characterized in that the quantum well light-emitting layer comprises a GaN layer and an $In_xGa_{1-x}N$ layer which are arranged repeatedly in sequence, wherein x is set as 0.2-0.3 and the number of repetitions is 7-12; the thickness of the GaN layer is 8-12 nm; and the thickness of the $In_xGa_{1-x}N$ layer is 2-5 nm.

6. An LED epitaxial wafer fabrication process, for fabricating the LED epitaxial wafer according to claim 1, characterized by comprising:

preparing a substrate, and growing a buffer layer on the substrate; wherein the growth temperature of the buffer layer is 800-1100° C.;

growing an unintentionally doped GaN layer on the buffer layer; wherein the growth temperature of the unintentionally doped GaN layer is 1000-1400° C.;

growing a first N_SL layer and a second N_SL layer repeatedly in sequence on the unintentionally doped GaN layer to provide an N_SL layer; wherein the number of repetitions is 10-20; the growth temperature of the first N_SL layer is 1000-1200° C.; the growth thickness of the first N_SL layer is 15-20 nm; the growth temperature of the second N_SL layer is 1000-1200° C.; and the growth thickness of the second N_SL layer is 30-35 nm;

growing a first N_Bulk layer on the N_SL layer; wherein the growth temperature of the first N_Bulk layer is 1000-1200° C.; the growth thickness of the first N_Bulk layer is 500-600 nm;

growing a second N_Bulk layer on the first N_Bulk layer; the growth temperature of the second N_Bulk layer is 900-1100° C.; the growth thickness of the second N_Bulk layer is 500-600 nm;

growing a quantum well light-emitting layer on the second N_Bulk layer; wherein the growth temperature of the quantum well light-emitting layer is 700-800° C.;

growing a P-type electron blocking layer on the quantum well light-emitting layer; wherein the growth temperature of the P-type electron blocking layer is 800-1000° C.; and growing a P-type GaN layer on the P-type electron blocking layer; wherein the growth temperature of the P-type GaN layer is 900-1100 C.

7. The LED epitaxial wafer fabrication process of claim 6, characterized in that the silicon doping concentration of the first N_SL layer is $1\times10^{18}$~$5\times10^{18}$/cm$^{-3}$; the silicon doping concentration of the second N_SL layer is $1\times10^{19}$~$3\times10^{19}$/cm$^{-3}$; the silicon doping concentration of the first N_Bulk layer is $1\times10^{19}$~ $3\times10^{19}$/cm$^{-3}$; and the silicon doping concentration of the second N_Bulk layer is $5\times10^{18}$~$1\times10^{19}$/cm$^{-3}$.

* * * * *